United States Patent
Lee et al.

(10) Patent No.: US 11,579,178 B1
(45) Date of Patent: Feb. 14, 2023

(54) INSPECTION APPARATUS FOR BARE CIRCUIT BOARD

(71) Applicant: Unimicron Technology Corp., Taoyuan (TW)

(72) Inventors: Hsin-Hung Lee, Taoyuan (TW);
Chun-Hsien Chien, New Taipei (TW);
Yu-Chung Hsieh, Taoyuan (TW);
Yi-Hsiu Fang, Taoyuan (TW);
Tzyy-Jang Tseng, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/647,012

(22) Filed: Jan. 4, 2022

(30) Foreign Application Priority Data

Oct. 27, 2021 (TW) .................................. 110139927

(51) Int. Cl.
*G01R 29/08* (2006.01)

(52) U.S. Cl.
CPC ..... *G01R 29/0878* (2013.01); *G01R 29/0871* (2013.01)

(58) Field of Classification Search
CPC .................. G01R 29/0878; G01R 29/0871
See application file for complete search history.

(56) References Cited

U.S. PATENT DOCUMENTS

| | | | | |
|---|---|---|---|---|
| 2004/0100297 A1* | 5/2004 | Tanioka | ............ | G01R 31/2891 324/750.1 |
| 2011/0148451 A1* | 6/2011 | Swart | ............... | G01R 31/31905 324/756.05 |
| 2012/0126821 A1* | 5/2012 | Forstner | ............ | G01R 31/2822 455/226.2 |
| 2015/0097575 A1* | 4/2015 | Hiraga | ................ | G01R 31/002 324/537 |
| 2015/0160264 A1* | 6/2015 | Rada | ................. | G01R 31/3025 324/754.21 |

FOREIGN PATENT DOCUMENTS

| | | |
|---|---|---|
| CN | 107247192 A | 10/2017 |
| TW | I693414 B | 5/2020 |
| TW | M595760 U | 5/2020 |
| TW | I697681 B | 7/2020 |

* cited by examiner

*Primary Examiner* — Alvaro E Fortich
(74) *Attorney, Agent, or Firm* — CKC & Partners Co., LLC

(57) ABSTRACT

An inspection apparatus used for inspecting a bare circuit board is provided, where the bare circuit board includes an antenna. The inspection apparatus includes a holding stage, a probing device, and a measurement device. The holding stage can hold the bare circuit board. The measurement device is electrically connected to the probing device and electrically connected to the antenna via the probing device. The measurement device can input a first testing signal to the antenna. The antenna can input a second testing signal to the measurement device after receiving the first testing signal. The measurement device can measure the antenna according to the second testing signal, where the first testing signal and the second testing signal both pass through no active component.

10 Claims, 5 Drawing Sheets

INSPECTION APPARATUS FOR BARE CIRCUIT BOARD

CROSS-REFERENCE TO RELATED APPLICATION

This application claims priority to Taiwan Application Serial Number 110139927, filed Oct. 27, 2021, which is herein incorporated by reference in its entirety.

BACKGROUND

Technical Field

The present disclosure relates to an inspection apparatus. More particularly, the present disclosure relates to an inspection apparatus for a bare circuit board.

Description of Related Art

Most circuit boards employed in conventional mobile devices (such as smartphones and tablet computers) have antennas, so that the mobile device can have the function of wireless communication. This circuit board with the antenna will be inspected after it is manufactured, so as to ensure that the antenna can work. Before inspecting the circuit board, it is necessary to mount a chip for inspection to the circuit board at first, so that the chip is electrically connected to the antenna and able to control the antenna to transmit and receive wireless signals, thereby inspecting the antenna.

However, since the inspection for the antenna needs the chip for inspection, the current inspection for the antenna has to spend additional time and cost mounting the chip for inspection to the circuit board at first, so that the current inspection of the antenna of the circuit board is not only time-consuming, but also costly due to the demand for the chip for inspection.

SUMMARY

At least one embodiment of the disclosure provides an inspection apparatus for a bare circuit board which can directly inspect the circuit board where the previous chip has not been mounted.

An inspection apparatus according to at least one embodiment of the disclosure is used for inspecting a bare circuit board, in which the bare circuit board includes at least one antenna and a plurality of pads, and the antenna is electrically connected to at least one of the pads. The inspection apparatus includes a holding stage, a probing device and a measurement device. The holding stage is configured to hold the bare circuit board. The probing device is configured to electrically touch at least one of the pads, so that the probing device is electrically connected to the antenna via the pads. The measurement device is electrically connected to the probing device and electrically connected to the antenna via the probing device. The measurement device is configured to input the first testing signal to the antenna, and the antenna outputs a second testing signal to the measurement device after receiving the first testing signal. The measurement device measures the antenna according to the second testing signal, where both the first testing signal and the second testing signal pass through no active component.

Based on the above, the inspection apparatus according to the above embodiments can directly inspect the antenna of the bare circuit board without the chip for inspection. In contrast to the current inspection by using the chip, the inspection apparatus according to at least one embodiment of the disclosure can directly inspect the circuit board where the chip has not been mounted, thereby achieving the advantage of reducing cost and shortening the inspection time.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
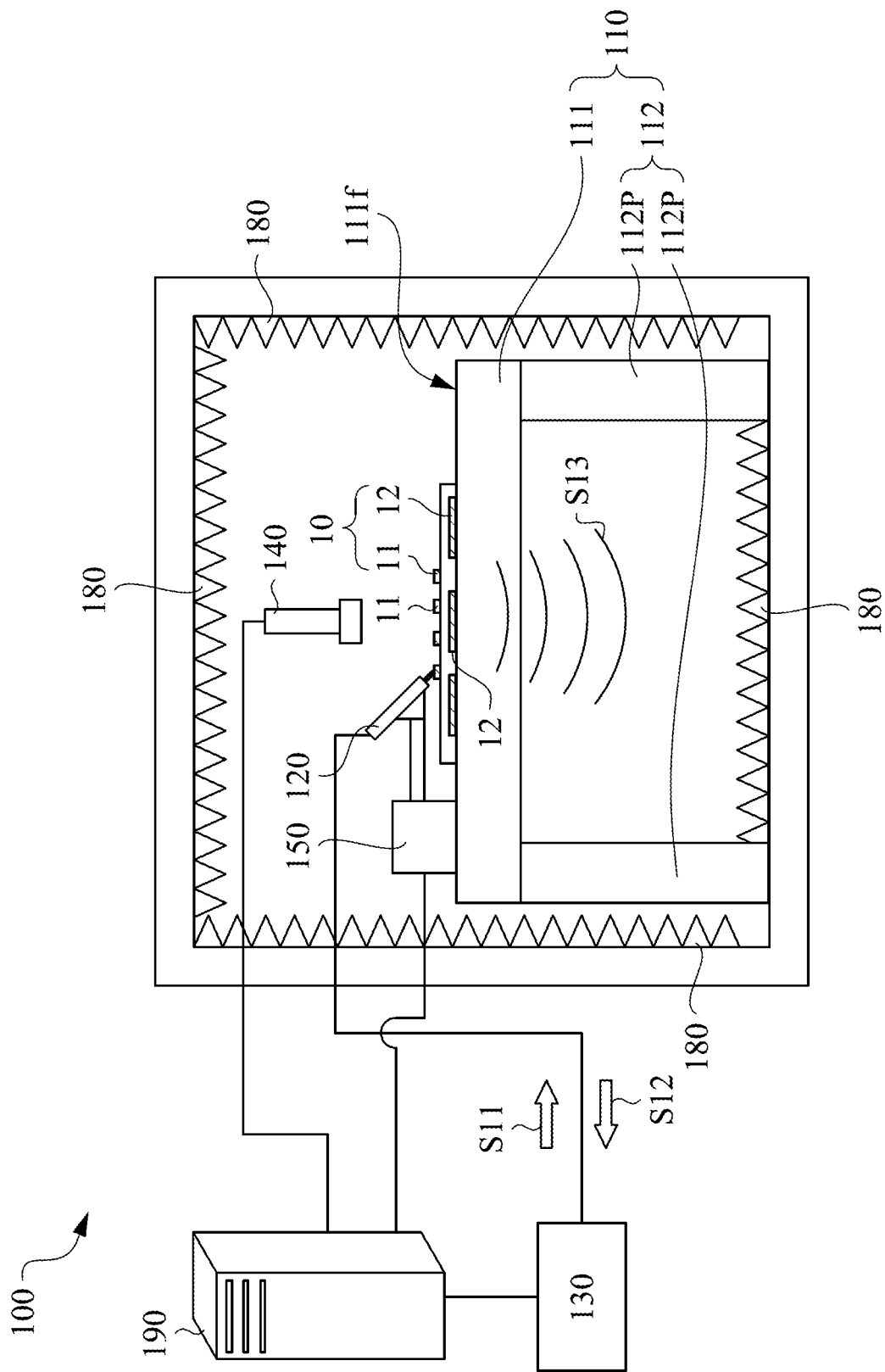
FIG. 1A is a schematic diagram of an inspection apparatus for bare circuit board according to at least one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions, and the quantity of some elements will be reduced. Accordingly, the description and explanation of the following embodiments are not limited to the quantity, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

FIG. 1A is a schematic diagram of an inspection apparatus for bare circuit board according to at least one embodiment of this disclosure. Referring to FIG. 1A, the inspection apparatus 100 can inspect the bare circuit board 10, in which the bare circuit board 10 includes a plurality of pads 11 and at least one antenna 12. Taking FIG. 1A for example, the bare circuit board 10 can include a plurality of antennas 12, whereas the quantity of the antenna 12 included by the bare circuit board 10 in other embodiment can be only one.

At least one antenna 12 is electrically connected to at least one of the pads 11. For example, the antennas 12 are electrically connected to at least some pads 11. The pads 11 can be connected to the antennas 12 through an interlayer connective structure (not shown), in which the interlayer connective structure can include at least one of a conductive through hole, a conductive blind via and a conductive buried via.

The bare circuit board 10 is a circuit substrate which is mounted with no active component. In other words, before the bare circuit board 10 is mounted with any active component, the electric signal entering any of the pads 11 will pass through no active component. That is, the electrical currents flowing in the bare circuit board 10 do not pass through any active component. In addition, the active component is a transistor or an integrated circuit (IC) with at least one transistor, for example, and the active component also may be a packaged chip or an unpackaged die (also called bare die).

It is necessary to note that the bare circuit board 10 is the circuit substrate which has been mounted with no active component, but the bare circuit board 10 can have a passive component, such as capacitor, inductor or resistor. For example, in other embodiment, the bare circuit board 10 can have an embedded passive component, which may be a discrete component, for example. Alternatively, at least one circuit layer of the bare circuit board 10 can form a passive component. For example, the bare circuit board 10 can have two adjacent and overlapping circuit layers, so as to form a capacitor.

Figure 1B:
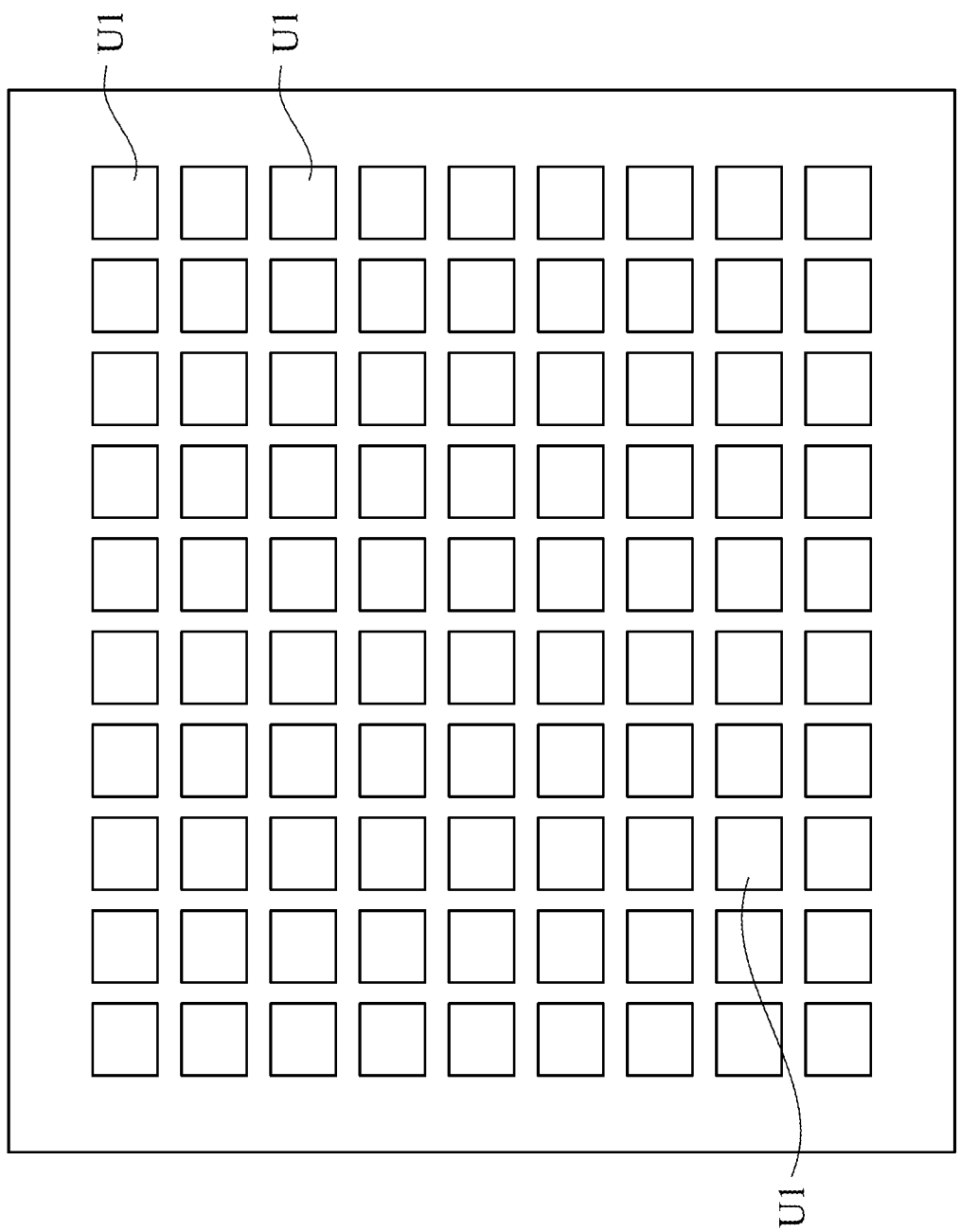
FIG. 1B is a top view of a bare circuit board which is able to be inspected by the inspection apparatus as shown in FIG. 1A.

FIG. 1B is a top view of a bare circuit board which is able to be inspected by the inspection apparatus as shown in FIG. 1A. Referring to FIGS. 1A and 1B, the bare circuit board 10 can be a working panel (also called "panel") or a strip, so the bare circuit board 10 can include a plurality of circuit board units (also called "units") U1, in which each of the circuit board units U1 includes a plurality of pads 11 and at least one antenna 12. After inspecting the bare circuit board 10, the qualified bare circuit board 10 can be divided into these circuit board units U1.

The bare circuit board 10 also can be a circuit board unit U1, so the quantity of the circuit board unit U1 included by the bare circuit board 10 also can be only one. Hence, the circuit board units U1 shown in FIG. 1B do not limit the quantity of the circuit board unit U1 included by the bare circuit board 10. Moreover, the bare circuit board 10 may be a printed circuit board (PCB), a carrier, a flexible wiring board or a flex-rigid wiring board, where the quantity of the circuit layers included by the bare circuit board 10 can be at least two.

It is necessary to note that the bare circuit boards 10 shown in FIGS. 1A and 1B are not on the same scale. Specifically, FIG. 1A mainly depicts the pads 11 and the antenna 12 and omits the circuit board units U1, so as to show the inspection of the bare circuit board 10 by the inspection apparatus 100. Hence, the bare circuit boards 10 shown in FIGS. 1A and 1B are not on the same scale. In addition, since the bare circuit board 10 also can be the circuit board units U1, the bare circuit board 10 shown in FIG. 1A also can be the circuit board units U1 shown in FIG. 1B.

Referring to FIG. 1A, the inspection apparatus 100 includes a holding stage 110, a probing device 120 and a measurement device 130. The holding stage 110 can hold the bare circuit board 10 and include a holding pad 111 and a support member 112, in which the holding pad 111 can be connected to the support member 112 and supported by the support member 112. In addition, in the embodiment as shown in FIG. 1A, the support member 112 can include a plurality of pillars 112p, for example, three or four pillars 112p, and the pillars 112p can be connected to the holding pad 111.

All of the holding pad 111 and the support member 112 may be electrical insulators, and the holding pad 111 has a holding surface 111f, where the bare circuit board 10 is disposed on the holding surface 111f. The dielectric constant (also called "relative permittivity") of the holding pad 111 can range between 1 and 20, and the best dielectric constant of the holding pad 111 is 1. The holding pad 111 can include a polymer. For example, the partial or whole holding pad 111 can be made of expanded polystyrene (EPS, also called styrofoam).

In the embodiment as shown in FIG. 1A, the whole holding pad 111 can be made of EPS, that is, the holding pad 111 can be a styrofoam board. In other embodiment, the holding pad 111 can include a styrofoam board and an insulation plate supporting the styrofoam board, in which the styrofoam board is disposed on the insulation plate, while the insulation plate is connected to the support member 112. The support member 112 shown in FIG. 1A can be omitted, and the holding pad 111 can remain, so that the holding stage 110 includes the holding pad 111 only. Hence, the holding stage 110 may be a styrofoam board or a thick styrofoam block, while the bare circuit board 10 can be disposed on the styrofoam board or the styrofoam block.

The measurement device 130 can be an analyzer, which is a vector network analyzer (VNA) or a time domain reflectometer (TDR), or other analyzer. The measurement device 130 is electrically connected to the probing device 120 which can be a probe card, a socket with pogo pin, a ground signal ground (GSG) probe or other probe. The probing device 120 is disposed above the holding stage 110 and able to electrically touch at least one of the pads 11, so that the probing device 120 can be electrically connected to at least one antenna 12 via the pads 11. Hence, the measurement device 130 can be electrically connected to at least one antenna 12 via the probing device 120.

When the inspection apparatus 100 inspects the bare circuit board 10, the probing device 120 can electrically touch the pads 11 and thus be electrically connected to the antenna 12, so that the measurement device 130 can input the first testing signal S11 to the antenna 12 via the probing device 120. The first testing signal S11 is an electric signal, which can be transmitted by the circuit only and cannot be transmitted by radiation or radio. The antenna 12 cannot only radiate the wireless signal S13, but also output the second testing signal S12 from the pads 11 and the probing device 120 to the measurement device 130 after receiving the first testing signal S11, in which the second testing signal S12 can be an electric signal generated by the antenna 12 due to the electromagnetic induction.

The measurement device 130 can measure the antenna 12 according to the second testing signal S12, so as to find out the situation that the antenna 12 radiates the wireless signal S13, thereby determine that the antenna 12 can work normally. For example, according to the second testing signal S12, the measurement device 130 can measure at least one of the return loss, the insertion loss, the over the air (OTA) and the signal shift of the antenna 12. The bare circuit board 10 is the circuit substrate which is mounted with no active component, and the electric current flowing in the bare circuit board 10 passes through no active component before the bare circuit board 10 is mounted with any active component. Hence, both the first testing signal S11 and the second testing signal S12 also pass through any active component.

Therefore, the inspection apparatus 100 can directly inspect the bare circuit board 10 without the chip for inspection, so as to pick the qualified bare circuit board 10 or circuit board units U1, and to eliminate the unqualified bare circuit board 10 or circuit board units U1. In contrast to the current inspection by using the chip for inspection, the inspection apparatus 100 of the embodiment can eliminate the extra time and cost of mounting the chip for inspection, thereby achieving the advantage of reducing cost and shortening the inspection time.

Since the bare circuit board 10 can be a working panel or a strip, the bare circuit board 10 can have quite a large size. For example, the bare circuit board 10 substantially may be a square board with a side length of about 50 cm and have an area of 2500 cm². Hence, when the measurement device 130 measures the bare circuit board 10, the probing device 120 can cover the part of the bare circuit board 10. In other words, the upper probing device 120 and the part of the bare circuit board 10 overlap. In addition, since the bare circuit board 10 also can be a circuit board unit U1 having quite a small size, the probing device 120 also can cover the bare circuit board 10 completely in other embodiment.

The inspection apparatus 100 can further include an image sensor 140 and a control device 190. The control device 190 may be a computer, such as a desktop computer, an industrial computer or a laptop. Alternatively, the control device 190 also may be a microprocessor. The control device 190 communicates with the measurement device 130 and the image sensor 140. For example, the control device 190 can be electrically connected to at least one of the measurement device 130 and the image sensor 140. Alternatively, the control device 190 can be in wireless communication with at least one of the measurement device 130 and the image sensor 140.

For example, the control device 190 can be electrically connected to the measurement device 130 and the image sensor 140 via a universal serial bus (USB). Alternatively, the control device 190 can be in wireless communication with the measurement device 130 and the image sensor 140 by Bluetooth or wireless network (such as Wi-Fi). Moreover, the control device 190 can be electrically connected to and in wireless communication with the measurement device 130 and the image sensor 140 separately. For example, the control device 190 can be electrically connected to the measurement device 130 and in wireless communication with the image sensor 140 by wireless network.

The control device 190 communicates with the measurement device 130 and the image sensor 140. Hence, the control device 190 can control the measurement device 130 to generate the first testing signal S11, and according to the second testing signal S12, the control device 190 can find out the situation that the antenna 12 radiates the wireless signal S13. The control device 190 also can control the image sensor 140 to capture the overhead image of the bare circuit board 10, in which the overhead image can be the partial or whole bare circuit board 10 as shown in FIG. 1B.

The image sensor 140 may be a camcorder or camera and have an image processor, so that the image sensor 140 can determine the pads 11 according to the overhead image. For example, the bare circuit board 10 can have at least one alignment mark (not shown), and the overhead image captured by the image sensor 140 has the image of the alignment mark. The image processor of the image sensor 140 can determine the circuit board units U1 and the pads 11 according to the image of the alignment mark, thereby obtaining the positions of the pads 11.

It is necessary to note that since the control device 190 communicates with the image sensor 140, the control device 190 also can determine the pads 11 according to the overhead image even if the image sensor 140 has no image processor. For example, the control device 190 also can determine the pads 11 via the alignment mark, so the image sensor 140 can have no image processor.

The inspection apparatus 100 can further include a driving device 150, such as a stepper motor. The driving device 150 is connected to the probing device 120 and can move the probing device 120. The control device 190 further communicates with the driving device 150, so the control device 190 can be in wireless communication with or electrically connected by wiring to the driving device 150. The control device 190 can drive the driving device 150 based on the overhead image captured by the image sensor 140, so that the driving device 150 can move the probing device 120 to the correct position, so as to cause the probing device 120 to electrically touch the correct pads 11 for inspection of the antenna 12. In addition, the control device 190 can store a program for inspection of the antenna 12, so that the inspection apparatus 100 can inspect the bare circuit board 10 automatically based on the program.

It is worth mentioning that the inspection apparatus 100 can further include a plurality of absorbing materials 180, in which the absorbing materials 180 can surround the bare circuit board 10 and the probing device 120. The absorbing materials 180 can absorb the wireless signal, such as the wireless signal S13, so that the absorbing materials 180 surrounding the bare circuit board 10 and the probing device 120 can prevent or reduce the interference of external wireless signals and the reflection of the wireless signal S13, so as to improve the accuracy of the inspection apparatus 100 inspecting the antenna 12 of the bare circuit board 10.

Figure 2A:
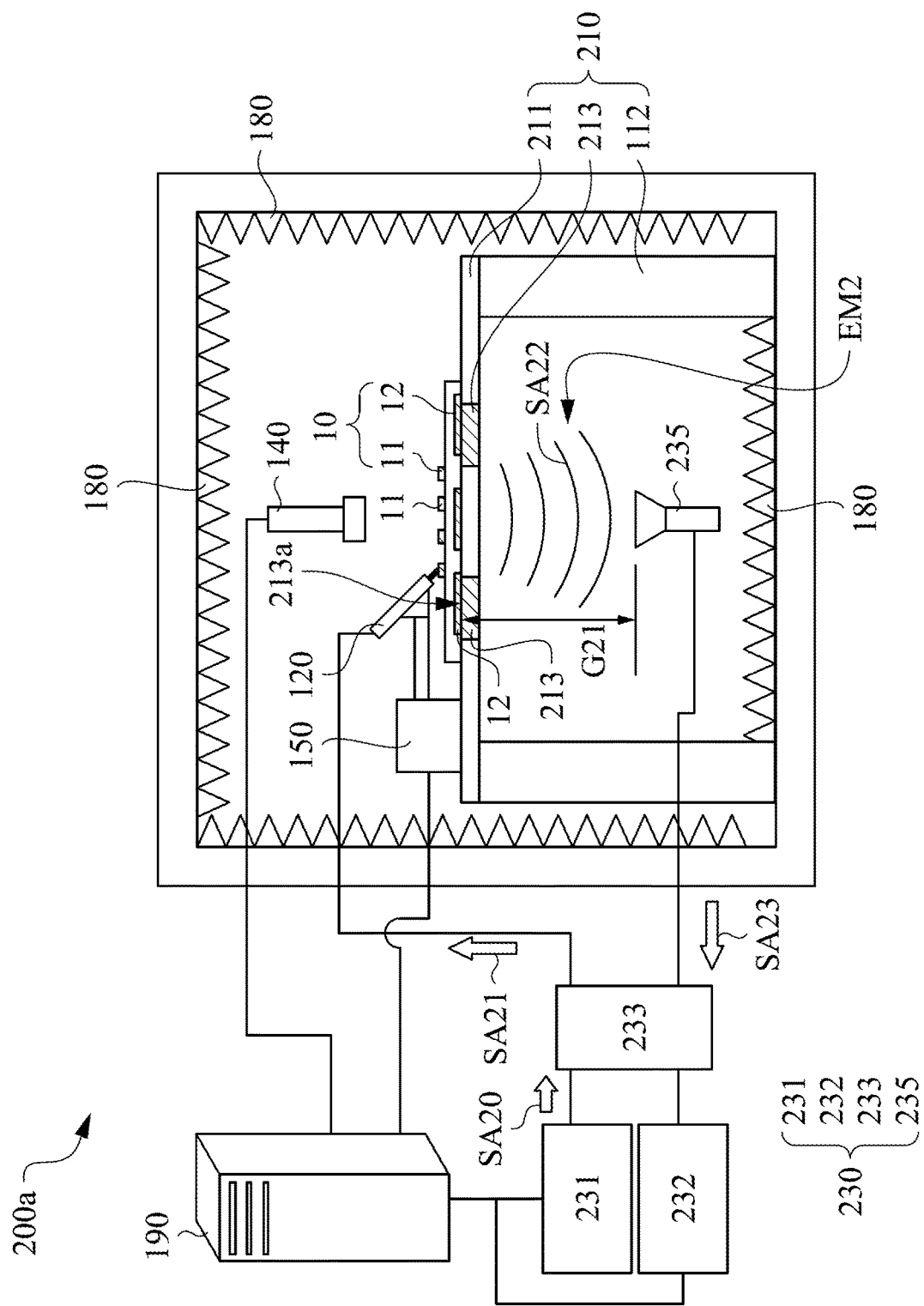
FIG. 2A is a schematic diagram of an inspection apparatus for bare circuit board according to another embodiment of this disclosure.

FIG. 2A is a schematic diagram of an inspection apparatus for bare circuit board according to another embodiment of this disclosure. Referring to FIG. 2A, the inspection apparatus 200a of the present embodiment includes the probing device 120, the image sensor 140, the driving device 150, the absorbing materials 180, the control device 190, a holding stage 210 and a measurement device 230, in which the control device 190 can communicate with the image sensor 140, the driving device 150 and the measurement device 230, so as to control the image sensor 140, the driving device 150 and the measurement device 230.

The inspection apparatus 200a is similar to the inspection apparatus 100. For example, the inspection apparatus 200a also can inspect the bare circuit board 10. The differences between the inspection apparatus 200a and 100 are mainly described below, while the similarities between the inspection apparatus 200a and 100 are basically not repeated. Specifically, the measurement device 230 can include a vector signal generator (VSG) 231, a vector signal analyzer (VSA) 232 and a transceiver antenna 235, in which the transceiver antenna 235 may be a horn antenna. The transceiver antenna 235 is electrically connected to the VSA 232 and can align with the antenna 12 which is to be measured.

The measurement device 230 can input a first testing signal SA21 to the antenna 12 by the probing device 120 and the pads 11 which electrically touch each other, in which the first testing signal SA21 is an electric signal. The antenna 12 can generate a second testing signal SA22 and input the second testing signal SA22 to the measurement device 230 after receiving the first testing signal SA21, where the second testing signal SA22 is the wireless signal which is radiated by the antenna 12. Since the bare circuit board 10 is the circuit substrate which is mounted with no active component, both the first testing signal SA21 and the second testing signal SA22 also pass through no active component.

The transceiver antenna 235 can receive the second testing signal SA22 and convert the second testing signal SA22 to the electric signal SA23, in which the electric signal SA23 is transmitted to the VSA 232, so that the measurement device 230 can measure the antenna 12 according to the second testing signal SA22. By using the VSG 231 and the VSA 232, the measurement device 230 can measure at least one of the error vector magnitude (EVM) and the transmitting power of the antenna 12 according to the second testing signal SA22. In addition, the control device 190 can control the measurement device 230 to generate the first testing signal SA21 and inspect the antenna 12 according to the second testing signal SA22, so as to pick the qualified bare circuit board 10 or circuit board units U1.

The measurement device 230 can further include a frequency converter 233 electrically connected to the VSG 231. The VSG 231 can generate an initial testing signal SA20, and the frequency converter 233 can change the frequency of the initial testing signal SA20, so as to convert the initial testing signal SA20 to the first testing signal SA21. For example, when the antenna 12 is a high frequency antenna, and the initial testing signal SA20 generated by the VSG 231 is a low frequency signal, the frequency converter 233 can convert the initial testing signal SA20 of low frequency to the first testing signal SA21 of high frequency. Accordingly, the antenna 12 receiving the first testing signal SA21 can radiate the second testing signal SA22, so that the inspection apparatus 200a can inspect the antenna 12.

Figure 2B:
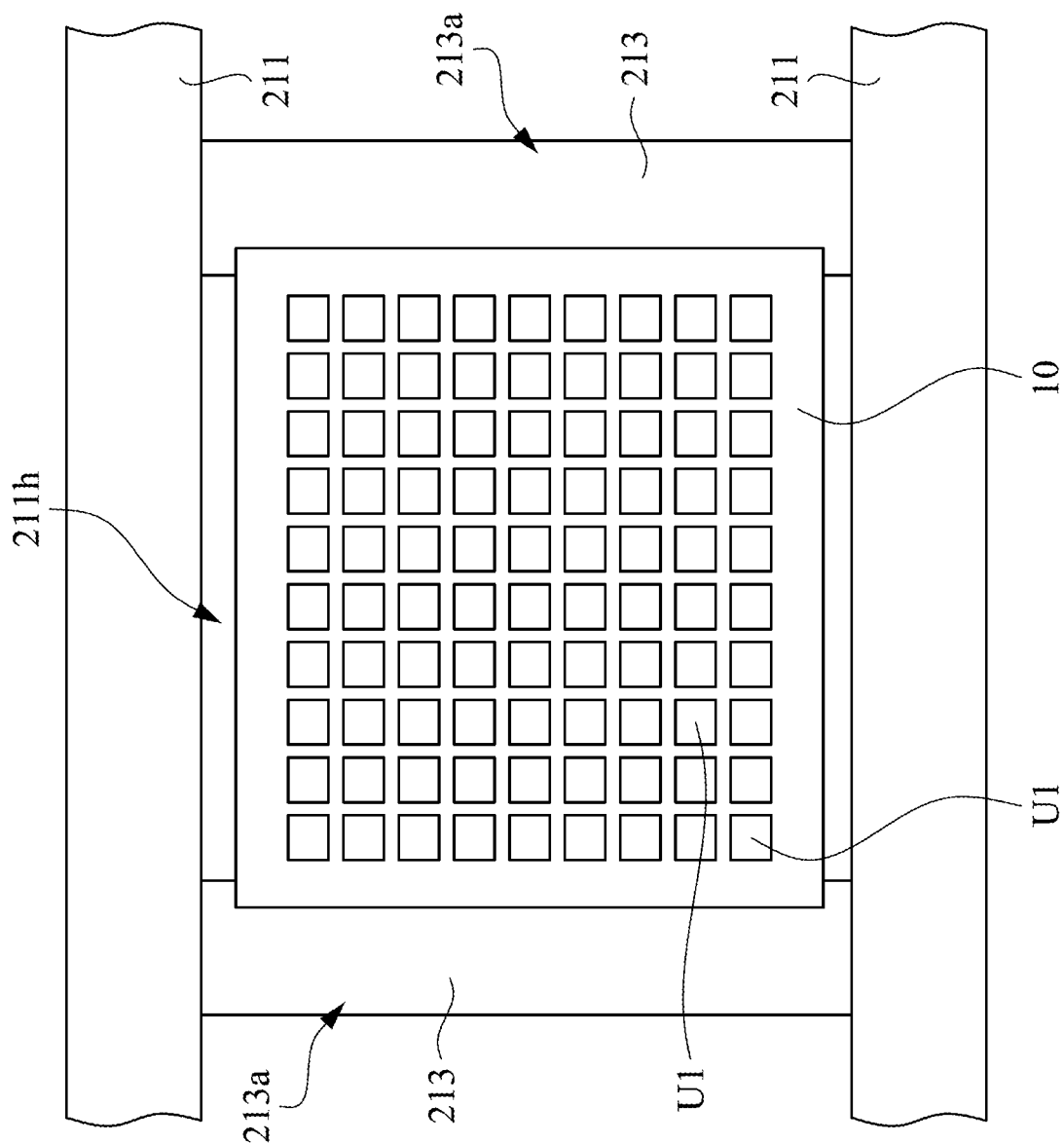
FIG. 2B is a top view of both the holding stage and the bare circuit board shown in FIG. 2A.

FIG. 2B is a top view of both the holding stage and the bare circuit board shown in FIG. 2A. Referring to FIGS. 2A and 2B, unlike the above holding stage 110, the holding stage 210 in the embodiment includes a support member 112, a frame 211 and at least two side-by-side holding bars 213. The frame 211 is connected to the support member 112 and has an opening 211h. The holding bars 213 are disposed in the opening 211h and connected to the frame 211, in which the holding bars 213 can be disposed movably on the frame 211, so that each of the holding bars 213 can move relative to the frame 211.

Each of the holding bars 213 has a holding surface 213a, in which the bare circuit board 10 is disposed on the holding surfaces 213a of the holding bars 213, and at least one antenna 12 is located between the holding bars 213. Since each of the holding bars 213 can move relative to the frame 211, the bare circuit board 10 can move within the opening 211h by the movement of the holding bars 213. In addition, when the measurement device 230 measures the antenna 12, the holding bars 213 do not overlap the antenna 12 being measured and also not overlap all of the antennas 12, so as to avoid affecting the measurement device 230 measuring the antenna 12.

The transceiver antenna 235 is disposed below the holding bars 213, in which an empty space EM2 exists between the holding bars 213 and the transceiver antenna 235. The empty space EM2 is basically a spatial range where the transceiver antenna 235 can receive the second testing signal SA22 effectively. The empty space EM2 includes an area between two adjacent holding bars 213 and another area between the transceiver antenna 235 and the bare circuit board 10.

The distance G21 between the antenna 12 and the transceiver antenna 235 can range between 0 and 2 m. The distance G21 is equal to the distance between the holding surface 213a and the transceiver antenna 235, and equivalent to the length of the empty space EM2. In the embodiment, the air or other non-conductor can exist in the empty space EM2, and no object, such as metal, which can considerably interfere with the transceiver antenna 235 receiving the second testing signal SA22 exist in the empty space EM2, so that the inspection apparatus 200a can inspect the antenna 12 accurately.

Figure 2C:
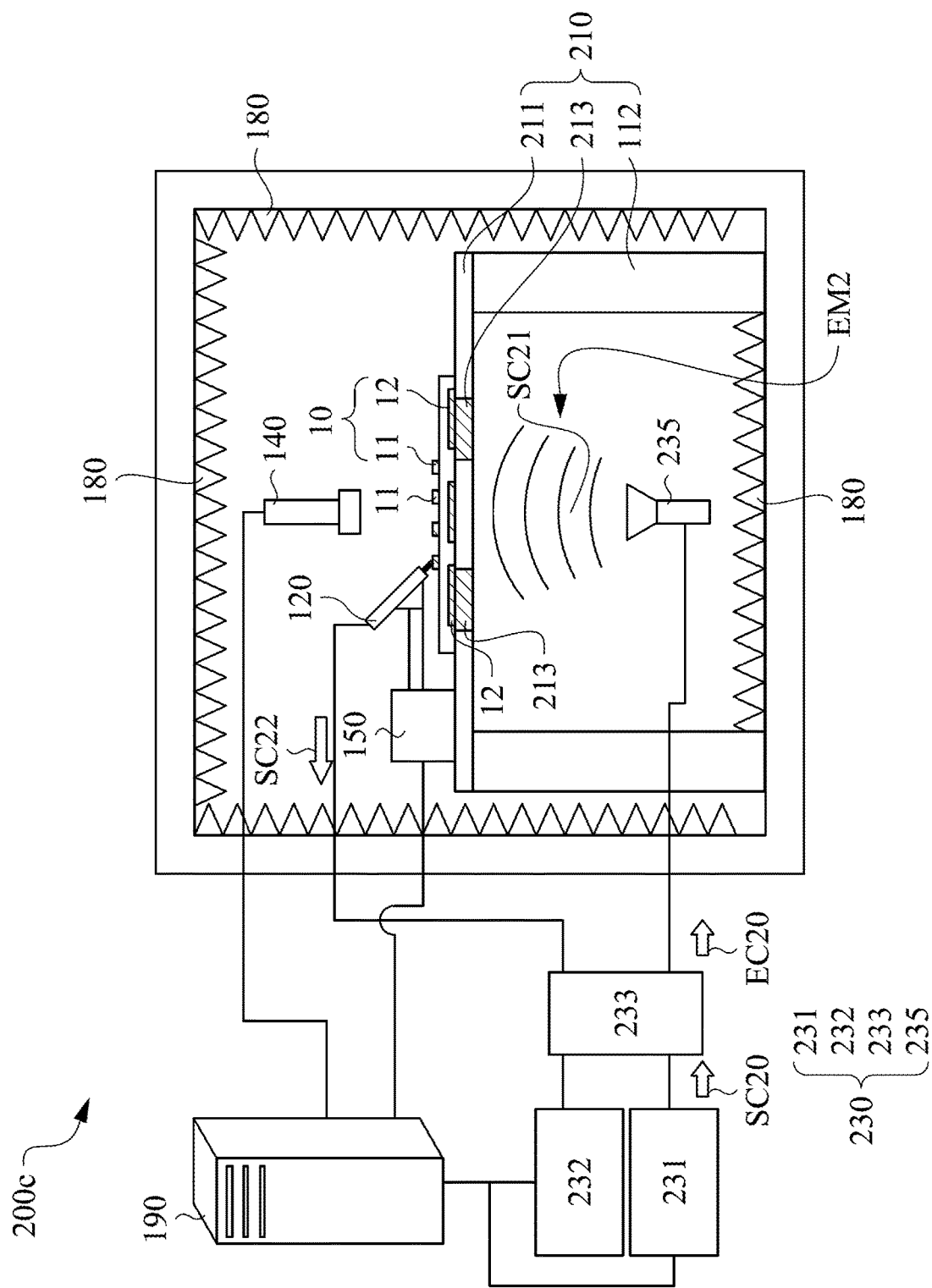
FIG. 2C is a schematic diagram of an inspection apparatus for bare circuit board according to another embodiment of this disclosure.

FIG. 2C is a schematic diagram of an inspection apparatus for bare circuit board according to another embodiment of this disclosure. Referring to FIG. 2C, the inspection apparatus 200c in the embodiment is similar to the inspection apparatus 200a in the previous embodiment, and the similarities between both of the embodiments are basically not repeated. Unlike the previous inspection apparatus 200a, in the embodiment, the transceiver antenna 235 in the inspection apparatus 200c is electrically connected to the VSG 231 of the measurement device 230 and can transmit a first testing signal SC21 to the antenna 12, where the first testing signal SC21 is the wireless signal which is radiated by the antenna 12.

When the transceiver antenna 235 transmits the first testing signal SC21, the antenna 12 can receive the first testing signal SC21 and generate a second testing signal SC22. The second testing signal SC22 is an electric signal, and the antenna 12 can input the second testing signal SC22 to the VSA 232 of the measurement device 230 via the probing device 120, so that the measurement device 230 can measure the antenna 12 according to the second testing signal SC22. By using the VSG 231 and the VSA 232, the measurement device 230 can measure at least one of the EVM and the receiving power of the antenna 12 according to the second testing signal SC22.

In the present embodiment, the VSG 231 can generate an initial testing signal SC20, and the frequency converter 233 can convert the initial testing signal SC20 to the electric signal EC20, and input the electric signal EC20 to the transceiver antenna 235, so that the transceiver antenna 235 can transmit the first testing signal SC21. For example, when the antenna 12 is a high frequency antenna, and the initial testing signal SC20 is a low frequency signal, the frequency converter 233 can convert the initial testing signal SC20 to the electric signal EC20 of high frequency, and transmit the electric signal EC20 to the transceiver antenna 235. Hence, the transceiver antenna 235 receiving the electric signal EC20 can transmit the first testing signal SC21 to the antenna 12, so that the antenna 12 can induce the second testing signal SC22.

It is especially noted that in the embodiments shown in FIGS. 2A and 2C, the measurement device 230 includes the frequency converter 233, but the measurement device 230 also cannot include the frequency converter 233 in other embodiment, where the VSG 231 can directly generate the first testing signal SA21 or the electric signal EC20. Hence, the frequency converter 233 shown in FIGS. 2A and 2C can be omitted. In addition, in the embodiments shown in FIGS. 1A, 2A and 2C, all of the inspection apparatus 100, 200a and 200c include the absorbing materials 180, but the inspection apparatus 100, 200a and 200c also can include no absorbing material 180 in other embodiment. Thus, the absorbing materials 180 shown in FIGS. 1A, 2A and 2C can be omitted.

Consequently, the inspection apparatus disclosed in the previous embodiments can directly inspect the antenna of the bare circuit board without the chip for inspection, so as to pick the qualified bare circuit board or circuit board units. In contrast to the current inspection by using the chip, the inspection apparatus of the embodiment has the advantage of reducing cost and shortening the inspection time, apparently.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An inspection apparatus used for inspecting a bare circuit board, wherein the bare circuit board comprises at least one antenna and a plurality of pads, the at least one antenna is electrically connected to at least one of the pads, and the inspection apparatus comprises:
   a holding stage configured to hold the bare circuit board;
   a probing device configured to electrically touch at least one of the pads, so that the probing device is electrically connected to the at least one antenna via the pads; and
   a measurement device electrically connected to the probing device and electrically connected to the at least one antenna via the probing device,
   wherein the measurement device is configured to input a first testing signal to the at least one antenna, and the at least one antenna outputs a second testing signal to the measurement device after receiving the first testing signal,
   wherein the measurement device measures the at least one antenna according to the second testing signal, and both the first testing signal and the second testing signal pass through no active component.

2. The inspection apparatus of claim 1, wherein the probing device is disposed above the holding stage, and the bare circuit board comprises a plurality of circuit board units,
   wherein the probing device covers a part of the bare circuit board when the measurement device measures the bare circuit board.

3. The inspection apparatus of claim 1, wherein the measurement device comprises:
   a vector signal generator (VSG);
   a vector signal analyzer (VSA); and
   a transceiver antenna electrically connected to the VSG or the VSA, wherein one of the first testing signal and the second testing signal is a wireless signal, and the transceiver antenna receives or transmits the wireless signal.

4. The inspection apparatus of claim 3, wherein the measurement device further comprises:
   a frequency converter electrically connected to the VSG, wherein the VSG is configured to generate an initial testing signal, and the frequency converter is configured to convert the initial testing signal to the first testing signal.

5. The inspection apparatus of claim 1, further comprising:
   an image sensor configured to capture an overhead image of the bare circuit board and to determine the pads according to the overhead image.

6. The inspection apparatus of claim 1, wherein the holding stage comprises:
   a support member;
   a frame connected to the support member and having an opening; and
   at least two side-by-side holding bars disposed in the opening and connected to the frame, wherein each of the holding bars has a holding surface, the bare circuit board is disposed on the holding surface of each of the holding bars, and the at least one antenna is located between the holding bars;
   wherein the holding bars do not overlap the at least one antenna when the measurement device measures the at least one antenna.

7. The inspection apparatus of claim 6, wherein the measurement device comprises:
   a transceiver antenna disposed below the holding bars and aligning with the at least one antenna, wherein an empty space or a non-conductor exists between the holding bars and the transceiver antenna.

8. The inspection apparatus of claim 1, wherein the measurement device is an analyzer.

9. The inspection apparatus of claim 1, wherein the holding stage comprises:
   a holding pad, wherein the holding pad is an electrical insulator and has a holding surface, and the bare circuit board is disposed on the holding surface.

10. The inspection apparatus of claim 9, wherein a dielectric constant of the holding pad ranges between 1 and 20.

* * * * *